US009331053B2

(12) United States Patent
Arora et al.

(10) Patent No.: US 9,331,053 B2
(45) Date of Patent: May 3, 2016

(54) STACKED SEMICONDUCTOR CHIP DEVICE WITH PHASE CHANGE MATERIAL

(71) Applicants: Manish Arora, Dublin, CA (US); Nuwan Jayasena, Sunnyvale, CA (US); Gabriel H. Loh, Bellevue, WA (US); Michael J. Schulte, Austin, TX (US)

(72) Inventors: Manish Arora, Dublin, CA (US); Nuwan Jayasena, Sunnyvale, CA (US); Gabriel H. Loh, Bellevue, WA (US); Michael J. Schulte, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/016,063

(22) Filed: Aug. 31, 2013

(65) Prior Publication Data
US 2015/0061150 A1   Mar. 5, 2015

(51) Int. Cl.
| H01L 21/00 | (2006.01) |
| H01L 25/065 | (2006.01) |
| H01L 23/00 | (2006.01) |
| H01L 23/427 | (2006.01) |

(52) U.S. Cl.
CPC .......... *H01L 25/0657* (2013.01); *H01L 23/427* (2013.01); *H01L 24/01* (2013.01); *H01L 24/80* (2013.01); *H01L 2225/06541* (2013.01); *H01L 2225/06589* (2013.01); *H01L 2924/01322* (2013.01)

(58) Field of Classification Search
CPC .............. H01L 23/3114; H01L 24/01; H01L 2221/68313
USPC ....................... 257/774; 438/15, 25
See application file for complete search history.

(56) References Cited

U.S. PATENT DOCUMENTS

| 6,353,208 | B1 | 3/2002 | Bostic et al. |
| 6,724,626 | B1 | 4/2004 | Hodes et al. |
| 7,170,000 | B2 | 1/2007 | Maeda et al. |
| 7,528,502 | B2 | 5/2009 | Maeda |
| 2008/0141681 | A1 | 6/2008 | Arnold |
| 2009/0121135 | A1 | 5/2009 | Warner et al. |
| 2009/0301691 | A1 | 12/2009 | Mohapatra |
| 2010/0059878 | A1* | 3/2010 | Crane et al. .................. 257/707 |

OTHER PUBLICATIONS

U.S. Appl. No. 14/194,701, Mar. 1, 2014, Arora et al.
U.S. Appl. No. 14/218,801, Mar. 18, 2014, Arora et al.
Wikipedia; *Computer Cooling*; http://en.wikipedia.org/wiki/Computer cooling; Dec. 13, 2012,; pp. 1-16.
Wikipedia; *Phase-change Material*; http://en.wikipedia.org/wiki/Phase-change material; Dec. 13, 2012; pp. 1-16.
Arunn Raghavan et al.; *Computational Sprinting*; In the Proceedings of the 18th Symposium on High Performance Computer Architecture (HPCA 2012); 2012; pp. 1-12.

(Continued)

*Primary Examiner* — Elias M Ullah
(74) *Attorney, Agent, or Firm* — Timothy M. Honeycutt

(57) ABSTRACT

Various stacked semiconductor chip arrangements and methods of manufacturing the same are disclosed. In one aspect, an apparatus is provided that includes a first semiconductor chip, a second semiconductor chip mounted on the first semiconductor chip, and a first portion of a phase change material positioned in a first pocket associated with the first semiconductor chip or the second semiconductor chip to store heat generated by one or both of the first and second semiconductor chips.

20 Claims, 7 Drawing Sheets

(56) References Cited

OTHER PUBLICATIONS

Midel; *Dielectric Insulating Fluid Overview*; www.midel.com; Dec. 2010; pp. 1-2.
Midel; *Natural Ester Dielectric Insulating Fluid Overview*; www.midel.com: Mar. 2014; pp. 1-2.
USPTO Office Action notification date Sep. 24, 2015; U.S. Appl. No. 14/194,701.
USPTO Office Action notification date Nov. 19, 2015; U.S. Appl. No. 14/218,801.
USPTO Final Office Action notification date Feb. 25, 2016; U.S. Appl. No. 14/194,701.

* cited by examiner

STACKED SEMICONDUCTOR CHIP DEVICE WITH PHASE CHANGE MATERIAL

BACKGROUND OF THE INVENTION

1. Field of the Invention

This invention relates generally to semiconductor processing, and more particularly to thermal management structures for stacked semiconductor chips and to methods of assembling the same.

2. Description of the Related Art

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid or other form of heat spreader is placed in thermal contact with the die. Many conventional integrated circuits generate sizeable quantities of heat that must be transferred away to avoid device shutdown or damage. A lid heat spreader serves as both a protective cover and a heat transfer pathway.

To provide a heat transfer pathway from the integrated circuit to the lid, a thermal interface material is placed on the upper surface of the integrated circuit. In an ideal situation, the thermal interface material fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. More recently, designers have begun to turn to solder materials as a thermal interface material, particularly for high power-high temperature chips.

A solder thermal interface material like indium has favorable thermal properties that work well for high power-high temperature die. However, indium exhibits relatively poor adhesion to silicon. To facilitate bonding with indium, the backside of a silicon die may be provided with a metallization stack that includes a layer that readily adheres to silicon, a layer that readily wets indium and perhaps one or more intermediary barrier or other layers. An entire wafer of dice may be provided with respective metallization stacks en masse prior to dicing. To establish favorable thermal contact between a conventional solder thermal interface material and the semiconductor chip and lid that bracket it, a reflow process is performed to wet the applicable surfaces.

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Another critical design issue associated with stacked semiconductor chips is thermal management. Most electrical devices dissipate heat as a result of resistive losses, and semiconductor chips and the circuit boards that carry them are no exception. Still another technical challenge associated with stacked semiconductor chips is testing. Stacked dice present an additional technical challenge for integration of both solder and organic thermal interface materials. A stacked dice arrangement is non-planar relative to the underlying package substrate, yet thermal contact between the solder thermal interface material, each chip and the heat spreader is often desired. The non-planarity can lead to inadequate thermal pathways to dissipate heat from the lowermost chip in the stack. This can limit the power and size for the lowermost die.

From a circuit design and performance perspective, it makes sense to place a high heat dissipating die, such as a processor, in a lower position in a 3D stack and thereafter stack lower heat dissipating dice, such as memory devices, on the lower die. Thermal management of this arrangement presents challenges. Thermal management of a semiconductor chip or chips in a stacked arrangement remains a technical challenge during normal operation and required electrical testing of one or more of the semiconductor chips. A given semiconductor chip in a stacked arrangement, whether the first, an intermediary or the last in the particular stack, may dissipate heat to such an extent that active thermal management is necessary in order to either prevent the one or all of the semiconductor chips in the stack from entering thermal runaway or so that one or more of the semiconductor chips in the stack may be electrically tested at near or true operational power levels and frequencies.

The present invention is directed to overcoming or reducing the effects of one or more of the foregoing disadvantages.

SUMMARY OF EMBODIMENTS OF THE INVENTION

In accordance with one aspect of an embodiment of the present invention, an apparatus is provided that includes a first semiconductor chip, a second semiconductor chip mounted on the first semiconductor chip, and a first portion of a phase change material positioned in a first pocket associated with the first semiconductor chip or the second semiconductor chip to store heat generated by one or both of the first and second semiconductor chips.

In accordance with another aspect of an embodiment of the present invention, a method of manufacturing is provided that includes providing a first semiconductor chip, mounting a second semiconductor chip on the first semiconductor chip, and positioning a first portion of a phase change material in a first pocket associated with the first semiconductor chip or the second semiconductor chip to store heat generated by one or both of the first and second semiconductor chips.

In accordance with another aspect of an embodiment of the present invention, a method of manufacturing is provided that includes providing a first semiconductor chip and a second semiconductor chip and fabricating a first pocket associated with the first semiconductor chip or the second semiconductor chip. A first portion of a phase change material is positioned in the first pocket to store heat generated by one or both of the first and second semiconductor chips. The second semiconductor chip is mounted on the first semiconductor chip.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various stacked semiconductor chip arrangements are disclosed. The disclosed embodiments incorporate a phase change material associated with one or more of the stacked semiconductor chips. The phase change material readily absorbs heat during phase change and thus facilitates heat management for the stack. Additional details will now be described.

Figure 1:
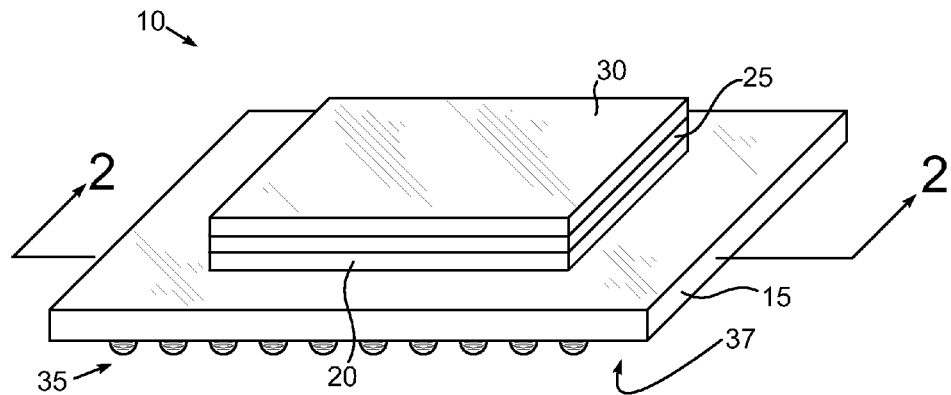
FIG. 1 is a pictorial view of an exemplary embodiment of a semiconductor chip device that may include multiple stacked semiconductor chips.

In the drawings described below, reference numerals are generally repeated where identical elements appear in more than one figure. Turning now to the drawings, and in particular to FIG. 1, therein is shown a pictorial view of an exemplary embodiment of a semiconductor chip device 10 that may include a circuit board 15 upon which multiple semiconductor chips 20, 25 and 30 are stacked. It should be understood that the number of chips 20, 25 and 30 may be two or more and may be in the 3D stacked arrangement depicted in FIG. 1 and/or a so-called 2.5D stacked arrangement where one or more chips are positioned on the circuit board 15 and separated laterally. The semiconductor chips 20, 25 and 30 may be any of a huge variety of different types of integrated circuits implemented in substrate form such as, for example, microprocessors, graphics processors, combined microprocessor/graphics processors, application specific integrated circuits, memory devices, active optical devices, such as lasers, or the like, and may be single or multi-core. Furthermore, one or more of the semiconductor chips 20, 25 and 30 could be configured as an interposer with or without some logic circuits. Thus the term "chip" includes an interposer and vice versa. The semiconductor chips 20, 25 and 30 may be constructed of bulk semiconductor, such as silicon or germanium, or semiconductor on insulator materials, such as silicon-on-insulator materials, or even other types of materials. In the embodiment depicted in FIG. 1, the semiconductor chips 20, 25 and 30 have similar footprints. However, it should be understood that the semiconductor chips 20, 25 and 30 may have dissimilar footprints. It may even be possible to fashion the uppermost semiconductor chip 30 with a larger footprint than the underlying chips 20 and 25 if such an overhang condition can be tolerated from a package integration standpoint.

The circuit board 15 may take on a variety of configurations. Examples include a semiconductor chip package substrate, a circuit card, or virtually any other type of printed circuit board. Although a monolithic structure could be used for the circuit board 15, a more typical configuration will utilize a buildup design. In this regard, the circuit board 15 may consist of a central core upon which one or more buildup layers are formed and below which an additional one or more buildup layers are formed. The core itself may consist of a stack of one or more layers. If implemented as a semiconductor chip package substrate, the number of layers in the circuit board 15 can vary from four to sixteen or more, although less than four may be used. So-called "coreless" designs may be used as well. The layers of the circuit board 15 may consist of an insulating material, such as various well-known epoxies, interspersed with metal interconnects. A multi-layer configuration other than buildup could be used. Optionally, the circuit board 15 may be composed of well-known ceramics or other materials suitable for package substrates or other printed circuit boards. The circuit board 15 is provided with a number of conductor traces and vias and other structures (not visible) in order to provide power, ground and signals transfers between the semiconductor chips 20, 25 and 30 and another device, such as another circuit board for example. To enable the circuit board 15 to interface with another electronic device, such as another circuit board (not shown) perhaps interconnect structures 35 may be positioned on the underside 37 of the circuit board 15. Here, the interconnect structures 35 may consist of a ball grid array although the skilled artisan will appreciate that pin grid arrays, land grid arrays or other types of interconnect structures may be used as well. Additional details of the semiconductor chip device 10 may be understood by referring now also to FIG. 2, which is a sectional view of FIG. 1 taken at section 2-2. The semiconductor chip 20 may electrically interface with the circuit board 15 by way of plural interconnect structures 40. The interconnect structures 40 may be solder bumps, solder microbumps, conductive pillars with or without solder enhancement or other types of interconnect structures.

Power, ground and signals may be propagated from the semiconductor chips 20, 25 and 30 to and from the circuit board 15 under a variety of ways. In this illustrative embodiment, power ground and signals may be transferred for example from the semiconductor chip 20 to the chips 25 and 30 and visa versa by way of plural thru-silicon-vias (TSVs). For example, the semiconductor chip 20 may include multiple TSVs 50a, 50b, 50c and 50d, the semiconductor chip 25 may be similarly provided with multiple TSVs 55a, 55b, 55c and 55d and the semiconductor chip 30 may be optionally provided with multiple TSVs 60a, 60b, 60c and 60d. Here, just four TSVs 50a, 50b, 50c and 50d for the semiconductor chip 20, four TSVs, 55a, 55b, 55c and 55d for the semiconductor chip 25 and four TSVs 60a, 60b, 60c and 60d for the semiconductor chip 30 are visible. However, the skilled artisan will appreciate that there may be large numbers of such TSVs for each of the chips 20, 25 and 30. Furthermore, for simplicity of illustration, a given set of TSVs, say the set of TSVs 50a, 50b, 50c and 50d, is aligned vertically with the next higher set of TSVs 55a, 55b, 55c and 55d and so on for the top set of TSVs 60a, 60b, 60c and 60d. However, the skilled artisan will appreciate that vertical alignment between TSVs from one chip to the next is not necessary since there is typically great flexibility in the routing of traces and pads and so forth to facilitate the routing of interconnects through a given chip. The TSVs 50a, 50b, 50c and 50d, 55a, 55b, 55c, 55d, 60a, 60b, 60c and 60d may be accompanied by multi-level metallization structures that consist of plural lines and traces and interconnecting vias as desired (not visible). Materials other than silicon may be used for any or all of the semiconductor chips 20, 25 and 30, and disclosed alternatives, so the term "thru-silicon-via" is intended to encompass more than silicon.

To manage the propagation of heat through the stack of semiconductor chips 20, 25 and 30, one or more of the semiconductor chips 20, 25 and 30 may be provided with a phase change material (PCM). A PCM will readily absorb and store heat while undergoing a change of physical phase, say from solid to liquid or from one solid phase to another. The heat can released later during periods of reduced power consumption by one or all of the semiconductor chips 20, 25 and 30. In this regard, the semiconductor chip 25 may be provided with a PCM 65 that is positioned in a pocket 70 associated with the semiconductor chip 25. Additional details of the pocket 70 will be illustrated in FIGS. 3 and 4 to be discussed below. The semiconductor chip 30 may be similarly fitted with a PCM 75 that is positioned in a pocket 80 associated with the semiconductor chip 30. The PCMs 65 and 75 may be so-called solid-to-liquid phase materials or solid phase-to-solid phase materials. A large variety of different types of PCMs may be used. In general, there are three varieties of PCMs: (1) organic; (2) inorganic; and (3) eutectic. These categories may be further subdivided as follows:

TABLE 1

| PCM MATERIAL CLASSIFICATION | | |
| --- | --- | --- |
| ORGANIC | INORGANIC | EUTECTIC |
| Paraffin | Salt Hydrate | Organic-Organic |
| Non-Paraffin | Metallic | Inorganic-Inorganic |
| | | Inorganic-Organic |

A variety of characteristics are desirable for the material(s) selected for the PCM's 65 and 75. A non-exhaustive list of the types of desired PCM characteristics includes a melting temperature $T_m$ less than but close to the maximum anticipated chip operating temperature $T_{max}$, a high latent heat of fusion, a high specific heat, a high thermal conductivity, small volume change and congruent melting (for solid-to-liquid), high nucleation rate to avoid supercooling, chemical stability, low or non-corrosive, low or no toxicity, nonflammability, non-explosive and low cost/high availability. Some of these characteristics may be favored over others for a given PCM. Table 2 below illustrates some exemplary materials for the PCM's 65 and 75.

TABLE 2

| Material | Melting Point $T_m$ (° C.) | Latent Heat of Fusion (kJ/kg) | Notes |
| --- | --- | --- | --- |
| Paraffin | | | The numbers in the first column represent the number of carbon atoms for a given form of paraffin |
| 21 | 40.2 | 200 | |
| 22 | 44.0 | 249 | |
| 23 | 47.5 | 232 | |
| 24 | 50.6 | 255 | |
| 25 | 49.4 | 238 | |
| 26 | 56.3 | 256 | |
| 27 | 58.8 | 236 | |
| 28 | 61.6 | 253 | |
| 29 | 63.4 | 240 | |
| 30 | 65.4 | 251 | |
| 31 | 68.0 | 242 | |
| 32 | 69.5 | 170 | |
| 33 | 73.9 | 268 | |
| 34 | 75.9 | 269 | |
| Hydrocinnamic acid | 48.0 | 118 | |
| Cetyl alcohol | 49.3 | 141 | |
| α-Nepthylamine | 50.0 | 93 | |
| Camphene | 50 | 238 | |
| O-Nitroaniline | 50.0 | 93 | |
| 9-Heptadecanone | 51 | 213 | |
| Thymol | 51.5 | 115 | |
| Methyl behenate | 52 | 234 | |
| Diphenyl amine | 52.9 | 107 | |
| p-Dichlorobenzene | 53.1 | 121 | |
| Oxalate | 54.3 | 178 | |
| Hypophosphoric acid | 55 | 21 | |
| O-Xylene dichloride | 55.0 | 121 | |
| β-Chloroacetic acid | 56.0 | 147 | |
| Chloroacetic acid | 56 | 130 | |
| Nitro naphthalene | 56.7 | 103 | |
| Trimyristin | 33-57 | 201-213 | |
| Heptaudecanoic acid | 60.6 | 189 | |
| α-Chloroacetic acid | 61.2 | 130 | |
| Bees wax | 61.8 | 177 | |
| Glyolic acid | 63.0 | 109 | |
| p-Bromophenol | 63.5 | 86 | |
| Azobenzene | 67.1 | 121 | |
| Acrylic acid | 68.0 | 115 | |
| Dinto toluent (2, 4) | 70.0 | 111 | |
| $Na_2HPO_4 \cdot 12H_2O$ | 40.0 | 279 | |
| $CoSO_4 \cdot 7H_2O$ | 40.7 | 170 | |
| $KF \cdot 2H_2O$ | 42 | 162 | |
| $MgI_2 \cdot 8H_2O$ | 42 | 133 | |
| $CaI_2 \cdot 6H_2O$ | 42 | 162 | |
| $K_2HPO_4 \cdot 7H_2O$ | 45.0 | 145 | |
| $Zn(NO_3)_2 \cdot 4H_2O$ | 45 | 110 | |
| $Mg(NO_3) \cdot 4H_2O$ | 47.0 | 142 | |
| $Ca(NO_3) \cdot 4H_2O$ | 47.0 | 153 | |
| $Fe(NO_3)_3 \cdot 9H_2O$ | 47 | 155 | |
| $Na_2SiO_3 \cdot 4H_2O$ | 48 | 168 | |
| $K_2HPO_4 \cdot 3H_2O$ | 48 | 99 | |
| $Na_2S_2O_3 \cdot 5H_2O$ | 48.5 | 210 | |
| $MgSO_4 \cdot 7H_2O$ | 48.5 | 202 | |
| $Ca(NO_3)_2 \cdot 3H_2O$ | 51 | 104 | |
| $Zn(NO_3)_2 \cdot 2H_2O$ | 55 | 68 | |
| $FeCl_3 \cdot 2H_2O$ | 56 | 90 | |
| $Ni(NO_3)_2 \cdot 6H_2O$ | 57.0 | 169 | |
| $MnCl_2 \cdot 4H_2O$ | 58.0 | 151 | |
| $MgCl_2 \cdot 4H_2O$ | 58.0 | 178 | |
| $CH_3COONa \cdot 3H_2O$ | 58.0 | 265 | |
| $Fe(NO_3)_2 \cdot 6H_2O$ | 60.5 | 126 | |
| $NaAl(SO_4)_2 \cdot 10H_2O$ | 61.0 | 181 | |
| $NaOH \cdot H_2O$ | 64.3 | 273 | |
| $Na_3PO_4 \cdot 12H_2O$ | 65.0 | 190 | |
| $LiCH_3COO \cdot 2H_2O$ | 70 | 150 | |
| $Al(NO_3)_2 \cdot 9H_2O$ | 72 | 155 | |
| $Ba(OH)_2 \cdot 8H_2O$ | 78 | 265 | |
| Eladic acid | 47 | 218 | |
| Lauric acid | 49 | 178 | |
| Pentadecanoic acid | 52.5 | 178 | |
| Tristearin | 56 | 191 | |
| Myristic acid | 58 | 199 | |
| Palmatic acid | 55 | 163 | |
| Stearic acid | 69.4 | 199 | |
| Gallium-gallium antimony eutectic | 29.8 | — | The dashes indicate the value is unknown to the inventors at this time |

TABLE 2-continued

| Material | Melting Point $T_m$ (° C.) | Latent Heat of Fusion (kJ/kg) | Notes |
|---|---|---|---|
| Gallium | 30.0 | 80.3 | |
| Cerrolow eutectic | 58 | 90.9 | |
| Bi-Cd-In eutectic | 61 | 25 | |
| Cerrobend eutectic | 70 | 32.6 | |
| Bi-Pb-In eutectic | 70 | 29 | |
| Bi-In eutectic | 72 | 25 | |
| Bi-Pb-tin eutectic | 96 | — | The dashes indicate the value is unknown to the inventors at this time |
| Bi-Pb eutectic | 125 | — | The dashes indicate the value is unknown to the inventors at this time |

Figure 2:
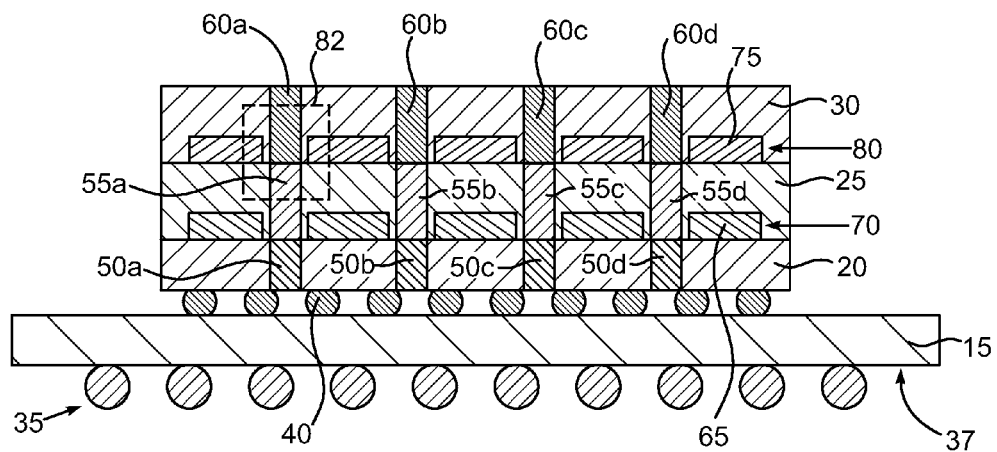
FIG. 2 is a sectional view of FIG. 1 taken at section 2-2.
Figure 3:
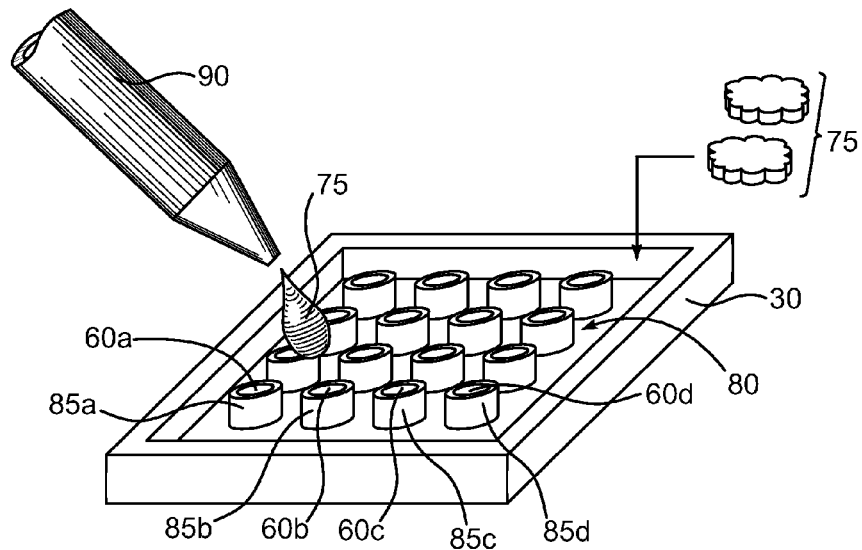
FIG. 3 is a pictorial view of one of the exemplary semiconductor chips undergoing exemplary phase change material application.

Additional details of the semiconductor chip 30, the PCM 75 and the pocket 80 associated therewith may be understood by referring now to FIG. 3. FIG. 3 is a pictorial view of a semiconductor chip 30 flipped over from the orientation depicted in FIGS. 1 and 2 to reveal the pocket 80. Each of the TSVs 60a, 60b, 60c and 60d may be surrounded laterally by an island 85a, 85b, 85c and 85d and may be composed of the same material as the chip 25 or from some insulating material such as silicon dioxide, silicon nitride, a polymer or some other material. These islands 85a, 85b, 85c and 85d may be omitted if the PCM 75 is not electrically conducting. If the PCM 75 is depositable in liquid form, then a suitable applicator 90 may be used. Conversely, the PCM 75 could be deposited in solid phase and interspersed around the TSVs 60a, 60b, 60c and 60d. The entire volume of the pocket 80 need not be filled with the PCM 75. Indeed, some consideration must be given to the potential thermal expansion of the PCM 75 during heating cycles so that the PCM 75 does not exert excessive hydraulic or other pressure against the semiconductor chip 30 and the semiconductor chip 25 (see FIGS. 1 and 2) which might produce an unwanted delamination of the two structures.

Figure 4:
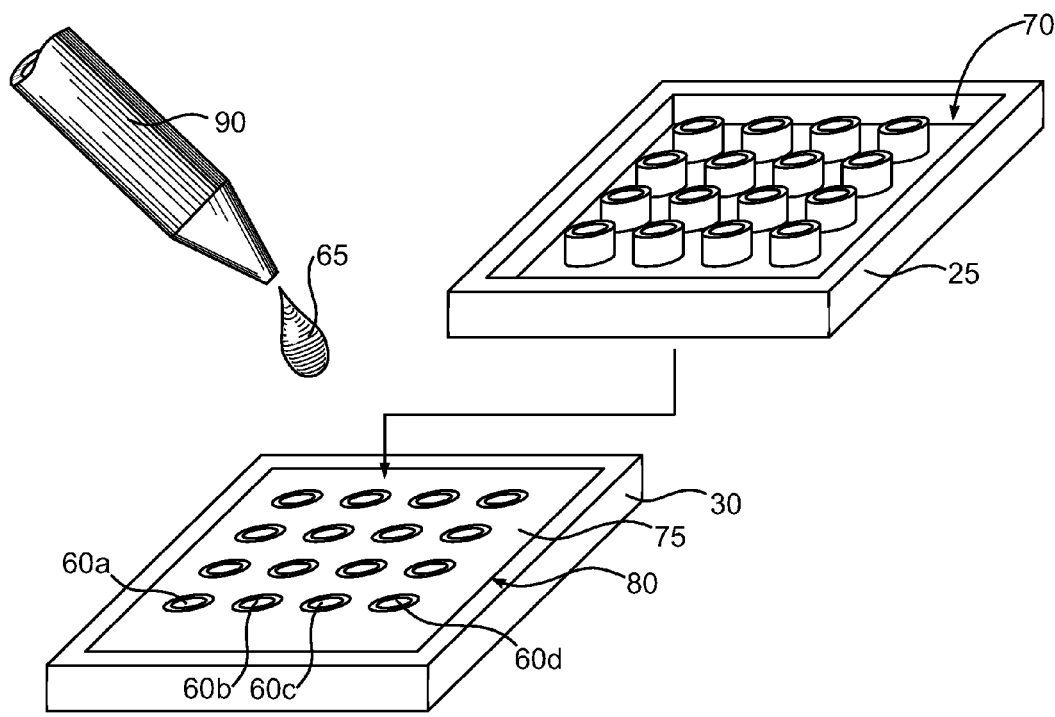
FIG. 4 is a pictorial view of the exemplary semiconductor chip of FIG. 3 following exemplary phase change material application and during stacking with another chip and PCM application.

FIG. 4 depicts a pictorial view of the semiconductor chip 30 following application of the PCM 75. In this illustration, it is assumed that the pocket 80 is entirely filled with the PCM 75. However, as just noted, this need not be the case. In any event, following the loading of the PCM 75 into the pocket 80, the semiconductor chip 25 may be stacked on the semiconductor chip 30 to enclose the pocket 80 and retain the PCM 75. At this point, the applicator 90 may be again used to place the PCM 65 in the pocket 70 of the semiconductor chip 25 as described above in conjunction with the semiconductor chip 30. These processes may be repeated as often as necessary depending upon the number of semiconductor chips 20, 25 and 30 in the stack.

Figure 5:
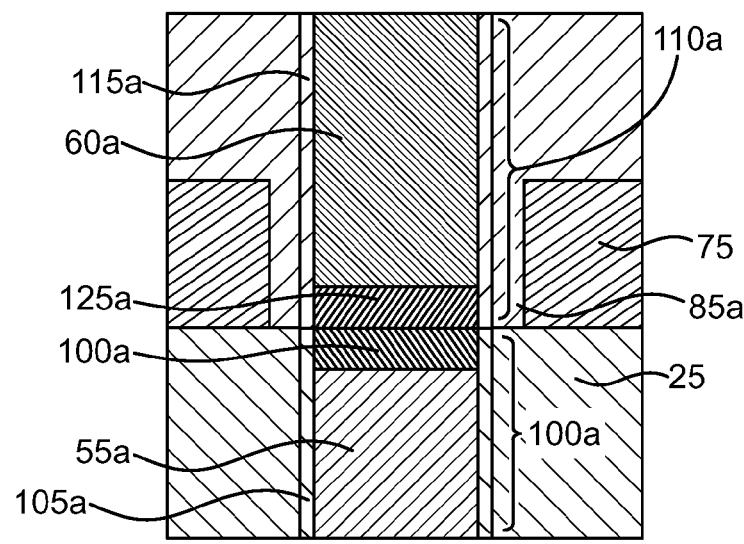
FIG. 5 is a portion of FIG. 2 shown at greater magnification.
Figure 6:
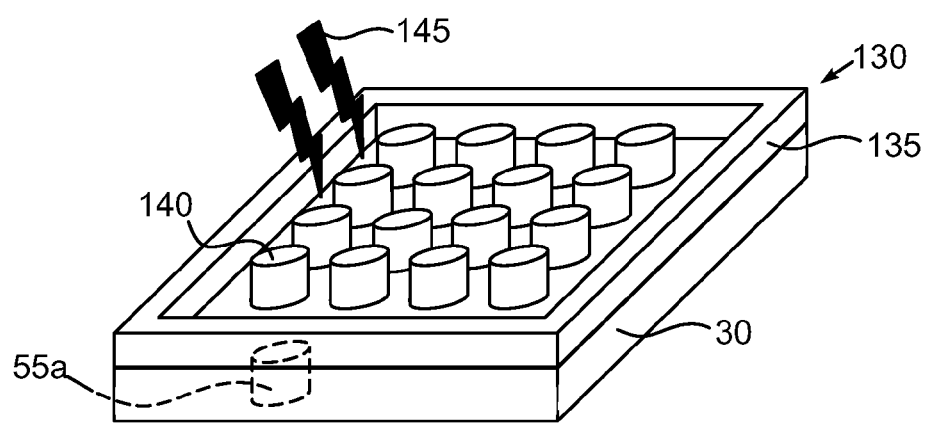
FIG. 6 is a pictorial view of one of the exemplary semiconductor chips undergoing exemplary phase change material pocket formation.

Additional details of an exemplary TSV may be understood by referring now to FIG. 5, which is an enlarged view of the portion of FIG. 2 circumscribed by the dashed rectangle 82. Note that because of the location of the dashed rectangle 82, FIG. 5 depicts a small portion of the semiconductor chips 25 and 30 and the TSVs 55a and 60a. The TSV 55a may consist of a pillar of conducting material such as, for example, copper, tungsten, graphene, aluminum, platinum, gold, palladium, alloys of these or like. Clad structures are envisioned. The formation of the TSVs 55a and 60a may be done using traditional practices for TSV formation. In particular, a via hole 100a may be formed in the semiconductor chip 25 followed by formation of a insulating liner layer 105a. The hole 100a may be chemically etched, laser drilled or otherwise fashioned. The liner layer 105a may be formed by oxidation, chemical vapor deposition, combinations of these or the like. In an exemplary embodiment, the liner layer 105 may be composed of silicon dioxide. However, other insulators may be used. The TSV 60a may be similarly formed by way of a via hole 110a and liner insulating layer 115a. The TSVs 55a and 60a may interface metallurgically by way of conductor pads 120a and 125a that may be joined by solder or other metallurgical joining techniques. Note that a portion of the PCM 75 surrounds the via island layer 85a.

The fabrication of a PCM pocket, and via islands if necessary, may be performed in a variety of ways. In an exemplary embodiment, a suitable lithography mask 130 consisting of a frame portion 135 that defines the outer bounds of the later-formed pocket and plural mask columns 140 positioned over the respective TSVs, only one of which is shown in phantom and numbered 55a. Thereafter, the semiconductor chip 30 may be etched with or without plasma enhancement 145 using etch chemistry suitable for the material of the chip 30. Laser drilling might be used if heat generation can be kept under control so that delicate circuit structures are not damaged.

Figure 7:
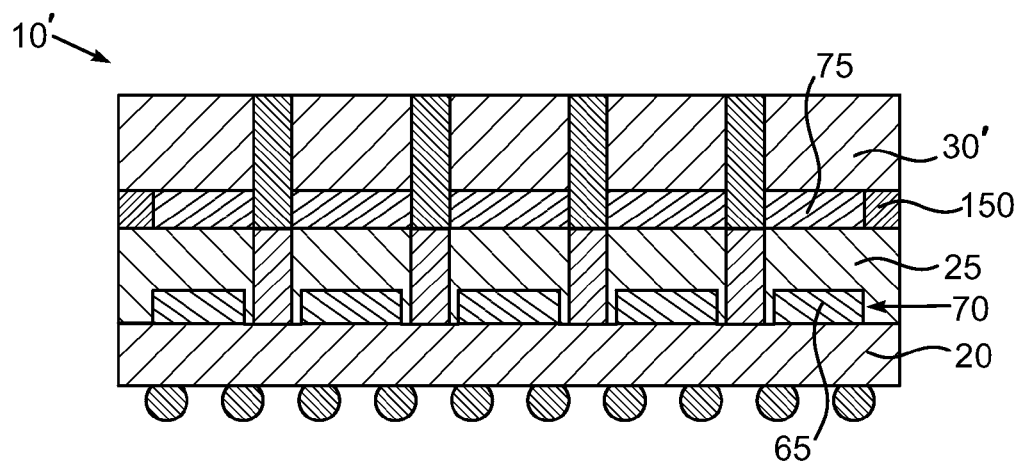
FIG. 7 is a sectional view like FIG. 2, but of an alternate exemplary embodiment of stacked semiconductor chip device.

In the foregoing illustrative embodiment, a given PCM pocket such as the pocket 80 is formed in a subtractive process where material is removed from the semiconductor chip 30 for example. However, the skilled artisan will appreciate that other techniques may be used to establish a pocket capable of holding a PCM. In this regard, attention is now turned to FIG. 7, which is a sectional view like FIG. 2 but of an alternate exemplary embodiment of a semiconductor chip device 10'. In this illustrative embodiment, the circuit board 15 is omitted for simplicity of illustration. However, the semiconductor chips 20 and 25 are shown and function as before. In addition, the semiconductor chip 30' is positioned on the semiconductor chip 25 but without an integrally formed pocket. Instead, a frame member 150 is positioned between the semiconductor chip 25 and the semiconductor chip 30 to enclose the PCM 75. The semiconductor chip 25 could be constructed in the same way or as shown like the embodiment depicted in FIGS. 1 and 2 where a pocket 70 is integrally formed with a semiconductor chip 25 to hold the PCM 65. It should be noted that the frame member 150 may be coupled first to the semiconductor chip 30' or to the semiconductor chip 25. A variety of materials may be used for the frame member 150. Corrosion resistance and favorable coefficients of thermal expansion are desirable characteristics. Examples include nickel plated copper, anodized aluminum, stainless steel, or the like. Metallic channel stiffener frames may be fabricated using forging, casting, or machining. A punching operation may be quite efficient. Moldable polymeric materials, such as Teflon or epoxies, could also be used. Suitable candidates for a moldable polymeric material include materials that may be molded, directly to the chip 25 without an adhesive if desired, and that exhibit desired coefficients of thermal expansion and bulk modulus. Lower stresses will be placed on the semiconductor chip 25 where the moldable material hardens into a frame 150 that has a coefficient of thermal expansion and a bulk modulus that approach or even equal that of the chip 25. Polymeric materials that may be lithographically patterned, such as polyimide or benzocyclobutene infused with photoactive compounds, could also be used.

Figure 8:
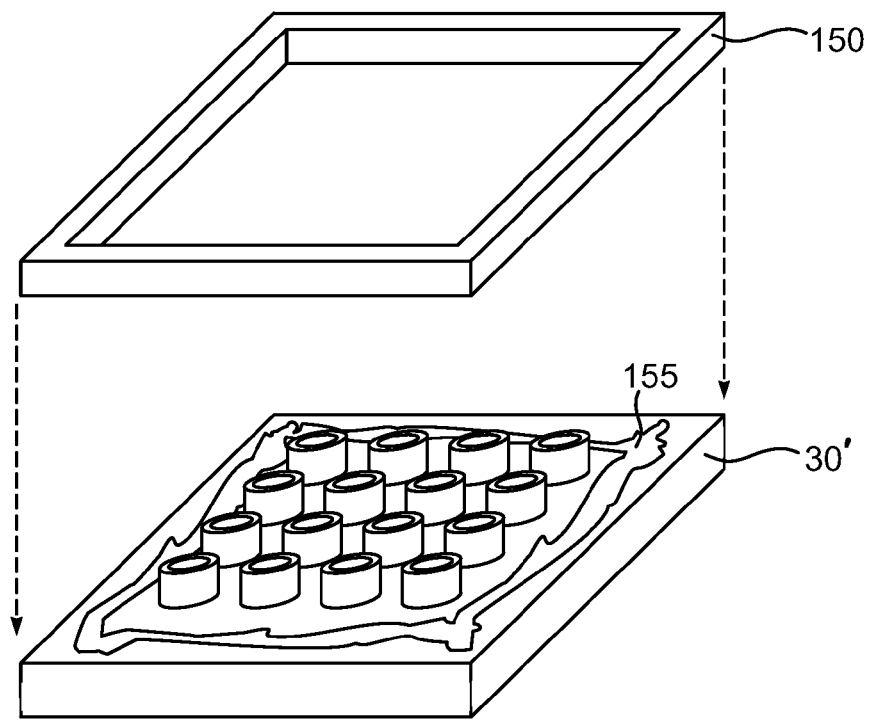
FIG. 8 is a pictorial view depicting exemplary application of a phase change material pocket frame to a semiconductor chip.

A variety of techniques may be utilized to form the frame member 150. As shown in FIG. 8, which is a pictorial view of the semiconductor chip 30', the frame member 150 may be pre-fabricated as a structural member and thereafter seated on the semiconductor chip 30'. Thereafter held in place by way of a suitable adhesive 155. Optionally, the frame member 150 may be molded on the semiconductor chip 30' using well known injection molding techniques.

Figure 9:
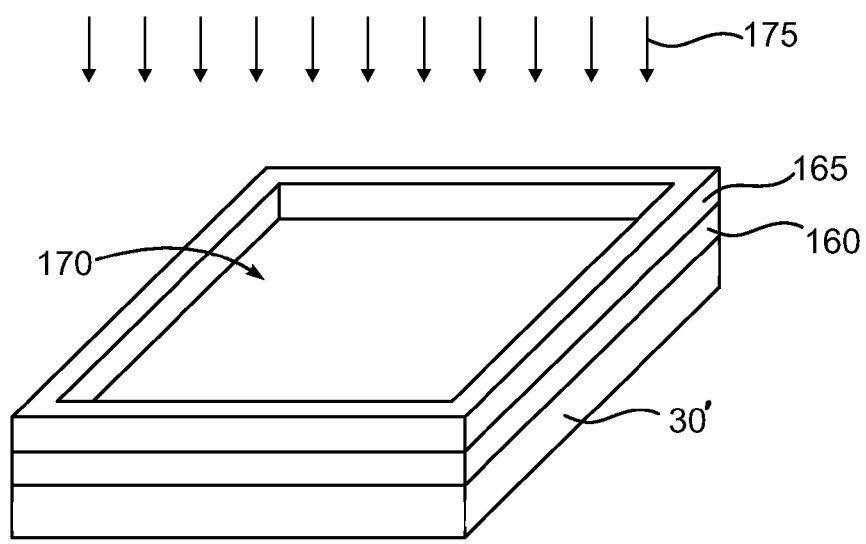
FIG. 9 is pictorial view like FIG. 8, but depicting exemplary mask application and material removal.
Figure 10:
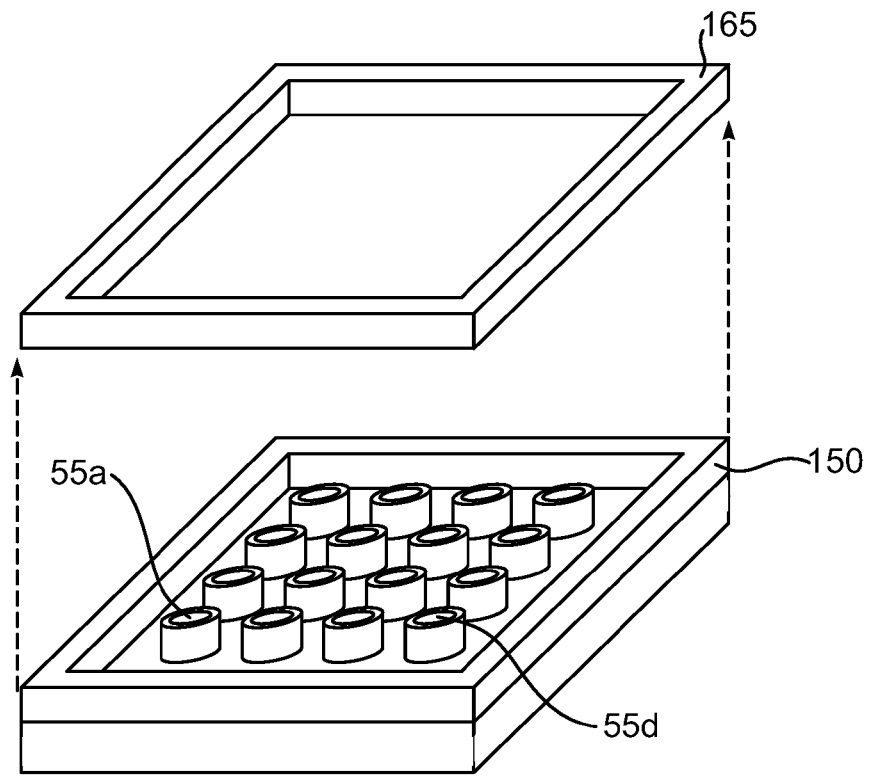
FIG. 10 is a pictorial view like FIG. 9, but depicting mask removal.

In still another exemplary embodiment, and as shown in FIGS. 9 and 10, the frame member may be applied as a film or sheet and thereafter a material removal process may be used to pattern the sheet into the desired framed member 150. For example, and as shown initially in FIG. 9, a film or sheet 160 may be applied to the semiconductor chip 30' and thereafter a lithography mask 165 may be patterned on the sheet 160. Following fabrication of the mask 165 with a suitable opening 170, and an etch process depicted schematically by the arrows 175 may be performed to remove unmasked portions of the sheet 160 to thereby expose the TSVs 55a, 55b, 55c and 55d as shown in FIG. 10 and to create the frame member 150 from the sheet or film 160 depicted in FIG. 9. Thereafter, the lithography mask 165 may be removed by ashing, solvent stripping or other mask removal techniques as shown in FIG. 10. In this sense, the frame member 150 may be constructed of a large variety of different types of materials that may be applied to a semiconductor chip and thereafter patterned by lithographic masking and material removal techniques.

It should also be understood that the PCMs 65 and 75 need not be the same material. Indeed, the thermal requirements of the semiconductor chip device 10 may be looked at as a whole to determine the individual thermal requirements for a particular interface, say the interface between the semiconductor chip 20 and the semiconductor chip 25. With that data in hand, the PCM 65 may be selected accordingly. Furthermore, it should be understood that the amount of PCM required for a given interface between two chips and thus the ultimate size of a given pocket such as the pocket 70 or 80 may be selected accordingly. Therefore, the pocket 70 need not be the same size or shape as the pocket 80.

Figure 11:
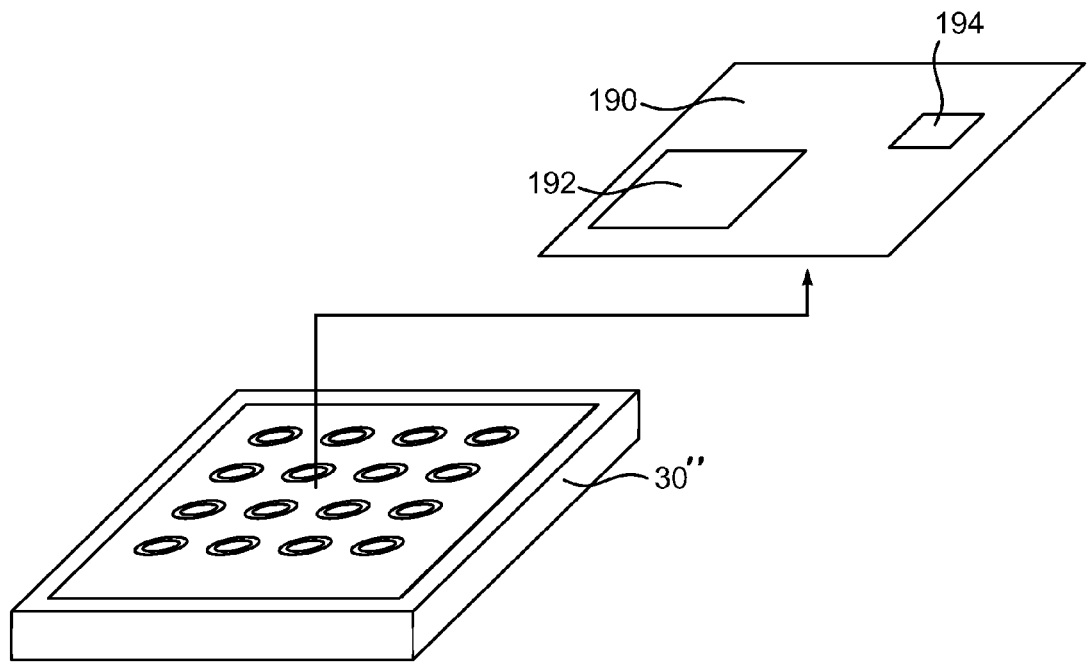
FIG. 11 is a pictorial view depicting exemplary thermal mapping of an exemplary semiconductor chip.
Figure 12:
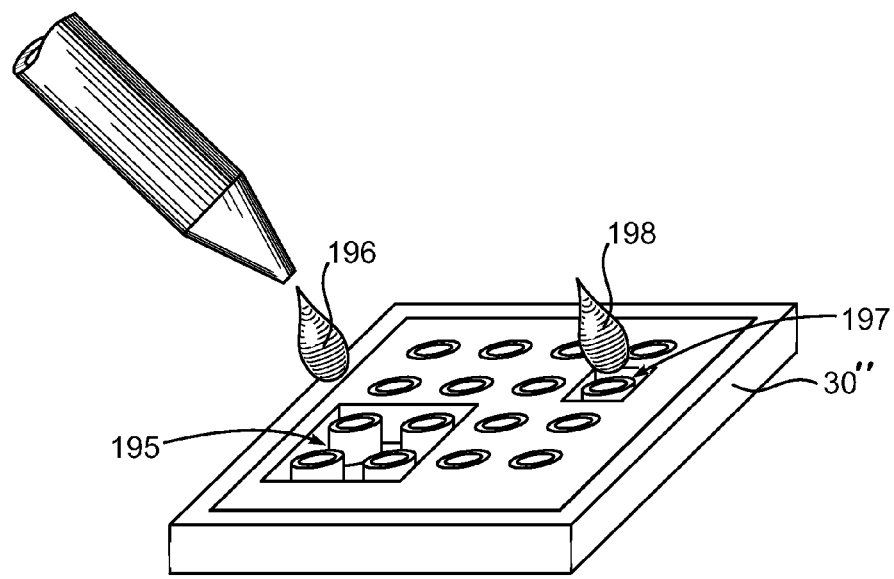
FIG. 12 is a pictorial view of the semiconductor chip of FIG. 11 undergoing hot spot-specific phase change material pocket creation and material application.

The skilled artisan will appreciate that a PCM pocket need not be coextensive with the footprint of a semiconductor chip. For example, it may be appropriate to thermally map a semiconductor chip to determine locations of particular hot spots and then selectively form one or more PCM pockets to place PCM at those hot spot locations. In this regard, attention is now turned to FIG. 11, which is a pictorial view of the semiconductor chip 30" shown pictorially along with a thermal map 190 thereof positioned above and to the right of the semiconductor chip 30". Note that the thermal map 190 shows two hot spots 192 and 194 where thermal management via PCM and associated PCM pockets is advantageous. Thus, and as shown in FIG. 12, the semiconductor chip 30" may be fabricated with a pocket 195 and a PCM 196 positioned therein and another pocket 197 and a PCM 198 positioned therein where the pockets 196 and 197 are located where the hot spots 192 and 194 from the thermal map 190 are located. Each chip slated for a stack may be thermally mapped and fitted with PCM(s) in this way.

Figure 13:
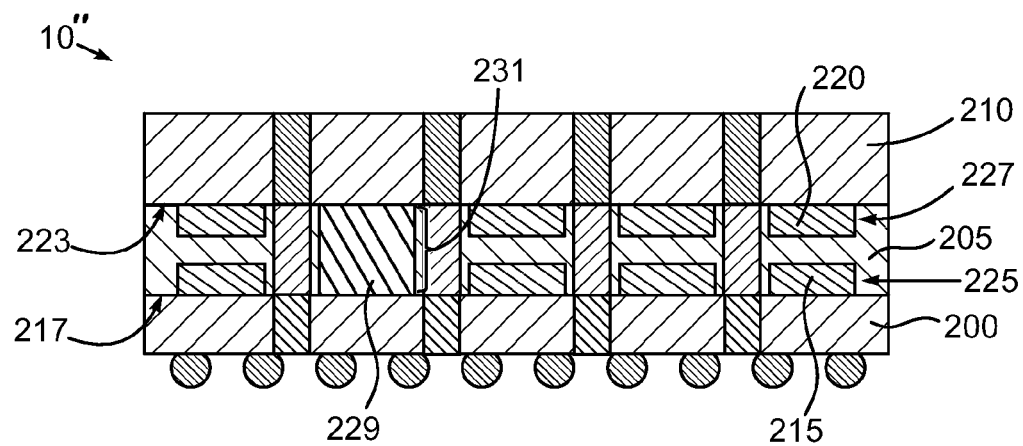
FIG. 13 is a sectional view of an alternate exemplary embodiment of a semiconductor chip device.

A PCM may be used in a variety of ways and geometries with stacked semiconductor chips. FIG. 13 depicts a sectional view of an alternate exemplary embodiment of a semiconductor chip device 10" that illustrates some of the possible variations of PCM configuration for stacked semiconductor chips. Here, a stack of three semiconductor chips 200, 205 and 210 is depicted. The chip 200 may be substantially identical to, for example, the semiconductor chip 20 described elsewhere herein. A PCM 215 may be located proximate a side 217 of the semiconductor chip 205 and an additional PCM 220 may be positioned proximate an opposite side 223 of the chip 205. The PCM 215 may be positioned in a pocket 225 formed using the techniques described elsewhere herein. The PCM 220 may be positioned in a pocket 227 formed proximate the opposite side 223 again using the techniques described elsewhere herein. In addition, another possible variation involves the usage of a PCM 229 that may be positioned in a pocket 231 that traverses the thickness of the semiconductor chip 205 and thus provides a direct thermal link between the semiconductor chip 200 and the top most semiconductor chip 210. This type of configuration using essentially a thru-silicon PCM should take into consideration routing and other internal logic structures of the chip 205. Finally, the semiconductor chip 210 may be positioned on the semiconductor chip 205 but not include a PCM or PCM pocket as shown. This example represents just a few of the possible number of configurations of PCM and semiconductor chip.

Figure 14:
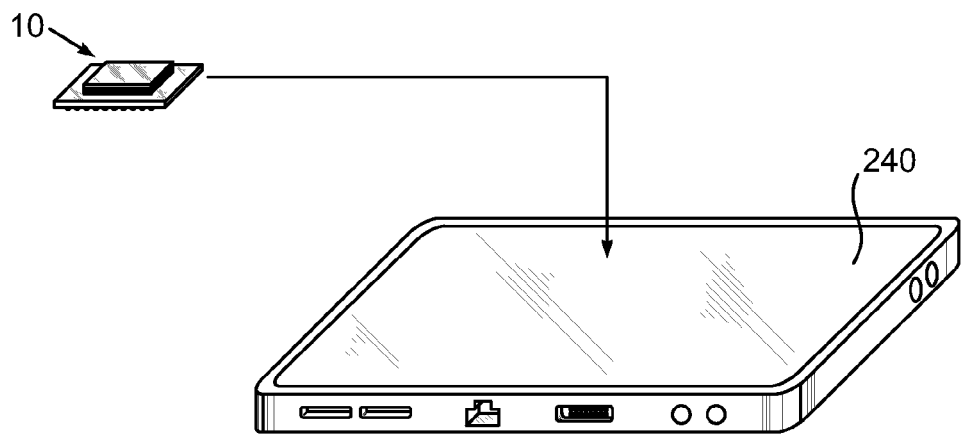
FIG. 14 is a pictorial view depicting exemplary placement of a semiconductor chip device in an exemplary electronic device.

Any of the illustrative embodiments of a semiconductor chip device 10, 10' or 10" may be mounted in an electronic device. For example, and as shown in FIG. 14, the semiconductor chip device 10 may be mounted into an electronic device 240. The electronic device 240 may be a computer, a digital television, a handheld mobile device, a personal computer, a server, a memory device, an add-in board such as a graphics card, or any other computing device employing semiconductors.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   providing a first semiconductor chip;
   mounting a second semiconductor chip on the first semiconductor chip; and
   positioning a first portion of a phase change material in a first pocket associated with the first semiconductor chip or the second semiconductor chip, the first pocket being operable to contain the first portion of the phase change material, the phase change material being operable to store heat generated by one or both of the first and second semiconductor chips while undergoing a physical phase change.

2. The method of claim 1, wherein the first pocket is in the first semiconductor chip.

3. The method of claim 1, wherein the first pocket is in the second semiconductor chip.

4. The method of claim 1, comprising positioning a second portion of a phase change material in a second pocket associated with the first semiconductor chip or the second semiconductor chip.

5. The method of claim 4, wherein the second pocket extends through the first semiconductor chip or the second semiconductor chip.

6. The method of claim 4, wherein the first pocket and the second pocket are positioned on opposite sides of the first or second semiconductor chips.

7. The method of claim 1, comprising at least one thru-silicon-via traversing the first pocket.

8. The method of claim 1, comprising coupling a circuit board to the first and second semiconductor chips.

9. The method of claim 1, wherein the pocket comprises a frame member positioned between the first and second semiconductor chips.

10. The method of claim 1, comprising positioning the first and second semiconductor chips in an electronic device.

11. A method of manufacturing, comprising:
   providing a first semiconductor chip and a second semiconductor chip;
   fabricating a first pocket associated with the first semiconductor chip or the second semiconductor chip;
   positioning a first portion of a phase change material in the first pocket, the first pocket being operable to contain the first portion of the phase change material the phase change material being operable to store heat generated by one or both of the first and second semiconductor chips while undergoing a physical phase change; and
   mounting the second semiconductor chip on the first semiconductor chip.

12. The method of claim 11, comprising fabricating the first pocket in the first semiconductor chip.

13. The method of claim 11, comprising fabricating the first pocket in the second semiconductor chip.

14. The method of claim 11, comprising fabricating a second pocket associated with the first semiconductor chip or the second semiconductor chip and positioning a second portion of a phase change material in the second pocket.

15. The method of claim 14, wherein the second pocket extends through the first semiconductor chip or the second semiconductor chip.

16. The method of claim 14, wherein the first pocket and the second pocket are positioned on opposite sides of the first or second semiconductor chips.

17. The method of claim 11, comprising fabricating at least one thru-silicon-via traversing the first pocket.

18. The method of claim 11, comprising coupling a circuit board to the first and second semiconductor chips.

19. The method of claim 11, wherein the fabricating the first pocket comprises coupling a frame member between the first and second semiconductor chips.

20. The method of claim 11, comprising positioning the first and second semiconductor chips in an electronic device.

* * * * *